ized Patent [19]

Kohara et al.

[11] Patent Number: 4,882,260
[45] Date of Patent: Nov. 21, 1989

[54] POSITIVE-WORKING PHOTOSENSITIVE QUINONE DIAZIDE COMPOSITION WITH ALKALI INSOLUBLE DYE AND ALKALI SOLUBLE DYE

[75] Inventors: Hidekatsu Kohara, Chigasaki; Nobuo Tokutake, Samukawa; Masanori Miyabe, Sagamihara; Toshimasa Nakayama, Hiratsuka; Shingo Asaumi, Fujisawa; Hatsuyuki Tanaka, Samukawa; Yoshiaki Arai, Yokohama, all of Japan

[73] Assignee: Tokyo Ohka Kogyo Co., Ltd., Lamagawa, Japan

[21] Appl. No.: 59,556

[22] Filed: Jun. 5, 1987

[30] Foreign Application Priority Data

Jun. 16, 1986 [JP] Japan ................. 61-138143

[51] Int. Cl.$^4$ ................................. G03C 1/60
[52] U.S. Cl. ..................... 430/191; 430/166; 430/190; 430/192
[58] Field of Search ............... 430/190, 191, 192, 197, 430/166, 311

[56] References Cited

U.S. PATENT DOCUMENTS

| | | | |
|---|---|---|---|
| 4,268,603 | 5/1981 | Sato | 430/197 |
| 4,370,405 | 1/1983 | O'Toole et al. | 430/166 |
| 4,377,631 | 3/1983 | Toukhy | 430/192 |
| 4,551,409 | 11/1985 | Gulla et al. | 430/192 |
| 4,575,480 | 3/1986 | Kotani et al. | 430/192 |
| 4,626,492 | 12/1985 | Eilbeck | 430/191 |
| 4,702,992 | 10/1989 | Ishii et al. | 430/191 |
| 4,731,319 | 3/1988 | Kohara et al. | 430/192 |

FOREIGN PATENT DOCUMENTS

| | | | |
|---|---|---|---|
| 1039475 | 8/1966 | United Kingdom | 430/191 |
| 1052699 | 12/1966 | United Kingdom | 430/191 |

OTHER PUBLICATIONS

Carlson, Bob et al., "Control of One Micron Lines in Integrated Circuits", Honeywell SSEC, Plymouth, Minnesota, Received by PTO on 6/7/85.

*Primary Examiner*—Charles L. Bowers, Jr.
*Attorney, Agent, or Firm*—Wyatt, Gerber, Burke and Badie

[57] ABSTRACT

The photosensitive composition, which is suitable as a photoresist material in fine patterning works for the manufacture of semiconductor devices, contains, as a photoextinctive agent, a combination of an alkali-insoluble dye and an alkali-soluble dye each having absorptivity of light in the wavelength region from 230 to 500 nm in a specified amount and in a specified ratio between them. By virtue of the formulation of combined dyes, the undesirable phenomenon of halation by the underlying aluminum coating layer on the substrate surface is greatly decreased so that patterned resist layer obtained with the composition is a high-fidelity reproduction of the original pattern even in a submicron range of fineness with good rectangularity of the cross sectional form of the patterned lines.

5 Claims, No Drawings

POSITIVE-WORKING PHOTOSENSITIVE QUINONE DIAZIDE COMPOSITION WITH ALKALI INSOLUBLE DYE AND ALKALI SOLUBLE DYE

BACKGROUND OF THE INVENTION

The present invention relates to a positive-working photosensitive composition or, more particularly, to a positive-working photosensitive composition capable of forming a patterned resist layer having excellent stability in dimensions and suitable for use, for example, in fine working of various semiconductor devices.

As is well known, the manufacturing process of many semiconductor devices, such as transistors, ICs, LSIs and the like, involves a step of photoetching. In the photoetching, a uniform layer of a photoresist material is formed on the surface of a silicon wafer and the photoresist layer is subjected to pattern-wise exposure to light through a photomask having a desired pattern and kept in direct contact with the photoresist layer followed by development to form a pattern-wise photoresist layer and etching of the exposed surface of the substrate to which selective diffusion of a dopant is subsequently undertaken. Usually, the above described process of photolithography to selective diffusion is repeated several times followed by forming electrodes and wirings by deposition of aluminum to finish a semiconductor device.

In the above described procedure for the manufacture of a semiconductor device including several times of photolithographic processing and selective diffusion, it is an unavoidable consequence that certain differences in levels of 1 μm or larger are produced on the surface. This difference in levels may be even larger after a passivation treatment.

When electrodes and wirings are to be formed on the wafer surface, a coating layer of aluminum is first formed thereon by the techniques of vacuum vapor deposition and the coating layer of aluminum must be patterned by the photoetching method. Namely, a photoresist layer is formed on the aluminum layer and exposed to light patternwise while the photoresist layer cannot be free from a strong effect of halation from the highly reflective aluminum surface to cause some problems. This problem due to halation is particularly serious when the vapor deposition of aluminum has been performed on the surface of a silicon wafer having a large difference in surface levels since the incident light beams projected perpendicularly to the surface of the wafer may be reflected not only at the flat areas of the surface but also at the boundary portion between areas having a difference in levels. Since the surface of the substrate at such a boundary portion is more or less inclined, the reflected light also contains an irregularly reflected component. Such an irregular reflection of light on the aluminum surface is one of the major reasons for the poor reproducibility of very fine line patterns having a line width of a few μm or smaller.

Various attempts and proposals have been hitherto made to decrease the undesirable effect due to halation by the reflection on the aluminum surface. One of the methods developed so far is the admixture of the photoresist composition with a photoextinctive dye. For example, Japanese Patent Kokai 59-142538 discloses a class of photoextinctive dyes suitable for such a purpose including specific azo compounds having at least one hydroxy group in a molecule.

These photoextinctive dyes are indeed effective to greatly reduce the halation in the photoresist layer admixed therewith in comparison with the same photoresist layer without the dye. The effectiveness of these dyes, however, is limited and not sufficient to comply with or follow up the rapidly increasing requirements in recent electronic technology toward finer and finer patterning of the photoresist layer since any smallest halation may badly affect the quality of the pattern reproduction. On a substrate surface having differences in levels, moreover, the thickness of the coating layer of the photoresist composition unavoidably cannot be very uniform allover the whole surface since the thickness is larger on the area at the lower side of the boundary between different levels than at the higher side. When a photoresist layer having such a difference in the thickness of the photoresist layer is exposed to light, the exposure dose on the area of a smaller thickness of the photoresist layer may exceed the optimum dose even when the same dose on the areas having a larger thickness of the photoresist layer is optimum or smaller. Needless to say, an overly exposure to light is accompanied by the enhancement of the adverse effect of halation to cause a problem that the patterned photoresist layer after development is not a high-fidelity reproduction of the original pattern with a decreased line width of the patterned line or the patterned line in the photoresist layer may have a cross sectional form deviated from ideal rectangularity. Therefore, any smallest halation may be responsible for the poor dimensional stability of the patterned resist layer. In some cases, a reproduction of a line pattern on the photomask may be a patterned photoresist layer of a broken line. Thus, it is imperative to minimize the problem due to halation in order to satisfy the requirements for extremely fine patterning of the photoresist layer on an aluminum layer.

SUMMARY OF THE INVENTION

An object of the present invention is to provide a positive-working photosensitive composition as a photoresist material capable of giving a patterned photoresist layer having excellent dimensional stability, by which the above described problems and disadvantages in the conventional positive-working photoresist compositions can be solved in order to comply with the requirement for finer and finer patterning as a trend in the rapidly progressing technology for the manufacture of semiconductor devices.

The positive-working photosensitive composition provided by the invention comprises:

(A) a film-forming polymeric resin;
(B) a photosensitizer;
(C) an alkali-insoluble dye having absorptivity of light in the wavelength region from 230 to 500 nm, such as coumarin-based dyes and specific azo compounds having no phenolic hydroxy group; and
(D) an alkali-soluble dye having absorptivity of light in the wavelength region from 230 to 500 nm, such as specific azo compounds having a phenolic hydroxy group.

It is preferable that the above mentioned components (A), (B), (C) and (D) in the inventive composition are compounded in such a proportion that the total amount of the components (C) and (D) is in the range from 0.5 to 10% by weight based on the total amount of the components (A) and (B) and the weight ratio of the component (C) to the component (D) is in the range from 1:1 to 1:4.

DETAILED DESCRIPTION OF THE PREFERRED EMBODIMENTS

As is understood from the above given summary of the invention, the most characteristic feature in the inventive photosensitive composition is in the formulation including two different types of dyes, of which one is alkali-insoluble and the other is alkali-soluble, having absorptivity of light in a specified wavelength region of 230 to 500 nm admixed with a combination of a film-forming resinous component, i.e. component (A), and a photosensitizing component, i.e. component (B).

The above mentioned alkali-insoluble dye can be any of dyes soluble in oils and organic solvents but insoluble in an aqueous alkaline solution and having absorptivity of light in the wavelength region from 230 to 500 nm or, preferably, from 300 to 460 nm. In particular, the alkali-insoluble dye is preferably a coumarin-based dye such as 3-(1H-benzimidazol-2-y1)-7-diethylamine coumarin and the like or an azo compound represented by the general formula

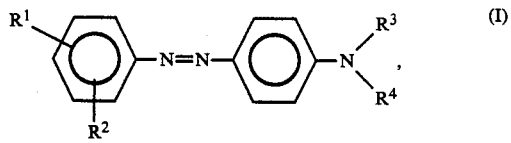

in which $R^1$ is a lower alkoxy group, such as methoxy, ethoxy, propoxy, butoxy, pentoxy and hexoxy groups, of which ethoxy is preferred, $R^2$ is a hydrogen atom or a lower alkyl group, such as methyl, ethyl, propyl and butyl groups, and $R^3$ and $R^4$ are each, independently from the other, an alkyl group having at least two carbon atoms, such as ethyl, propyl and butyl groups.

Exemplary of the particular azo compounds in conformity with the general formula (I) and suitable as the component (C) are: 4-ethoxy-4'-diethylamino azobenzene; 4-n-propyl-2-methoxy-4'-diethylamino azobenzene; 4-n-pentoxy-4'-diethylamino azobenzene; and the like. These azo compounds can be used either singly or as a combination of two kinds or more according to need.

The alkali-soluble dye as the component (D) in the inventive composition may be any of dyes soluble in an aqueous alkaline solution and having absorptivity of light in the wavelength region from 230 to 500 nm or, preferably, from 300 to 460 nm. It is however, usually preferable that the alkali-soluble dye is an azo compound having at least one phenolic hydroxy group in a molecule selected from the class consisting of the compounds represented by either one of the general formulas

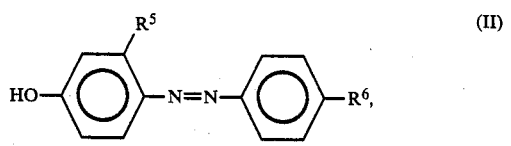

in which $R^5$ is a hydrogen atom or a hydroxy group and $R^6$ is a hydrogen atom, nitro group or a di(lower alkyl-)amino group, the lower alkyl group having, e.g., methyl, ethyl, propyl, butyl and pentyl groups,

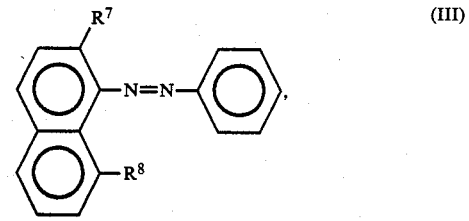

in which either one of $R^7$ and $R^8$ is a hydroxy group, the other being a hydrogen atom, and

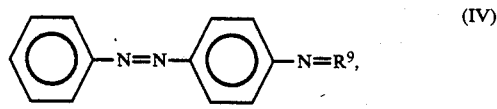

in which $R^9$ is a divalent group selected from the class consisting of 4-hydroxybenzylidene, 2-hydroxyphenylimino and 2-hydroxy α-naphthylimino groups. It is optional that the phenyl and naphthyl groups appearing in the general formulas (II), (III) and (IV) may have further one or more substituent groups according to need in addition to those already given in the formulas including lower alkyl groups, lower alkoxy groups, halogen atoms and hydroxy group.

Exemplary of the particular azo compounds in conformity with the general formula (II), (III) or (IV) and suitable as the component (D) in the inventive composition are: 4-hydroxy-4'-dimethylamino azobenzene; 4-hydroxy-4'-diethylamino azobenzene; 4-hydroxy-4'-dipropylamino azobenzene; 4-hydroxy-4'-dibutylamino azobenzene; 4-hydroxy-4'-dipentylamino azobenzene; 2,4-dihydroxy-4'-diethylamino azobenzene; 2,4-dihydroxy-4'-dipropylamino azobenzene; 2,4-dihydroxy-4'-dibutylamino azobenzene; 2,4-dihydroxy azobenzene; 2,4-dihydroxy-4'-nitro azobenzene; 4-(3-methoxy-4-hydroxybenzylidene)amino azobenzene; 2-hydroxynaphthalene-1-azonbenzene; 8-hydroxynaphthalene-1-azo(2'-methylbenzene); 8-hydroxynaphthalene-1-azo(2',4'-dimethylbenzene); 1-[4'-(2-methyl-1-phenylazo)-2'-methylphenylazo]-2-hydroxy benzene; 1-(4'-phenylazo-1'-phenylazo)-2-hydroxy naphthalene and the like. These azo compounds can be used either singly or as a combination of two kinds or more according to need.

The types of the components (A) and (B) in the inventive composition to be admixed with the above described two types of dyes are not particularly limitative and any of those used in the formulations of conventional positive-working photoresist compositions can be used. Preferably, however, the photosensitizing component therein as the component (B) should be a product obtained by a partial or complete esterification reaction or partial or complete amidation reaction between a sulfonic acid derived from a quinonediazido group-containing compound, such as quinone diazide, e.g., 1,2-benzoquinone diazide, 1,2-naphthoquinone diazide, 1,2-anthraquinone diazide and the like, and a compound having at least one phenolic hydroxy group or amino group in a molecule.

The above mentioned compound having at least one phenolic hydroxy group or amino group in a molecule is exemplified by polyhydroxy benzophenones, e.g., 2,3,4-trihydroxy benzophenone and 2,2',4,4'-tetrahydroxy benzophenone, alkyl gallates, aryl gallates, phenol, 4-methoxy phenol, dimethyl phenols, hydroquinone, bisphenol A, naphthols, pyrocatechol, pyrogallol, monomethyl ether of pyrogallol, pyrogallol-1,3-dimethyl ether, gallic acid, partially esterified or etherified gallic acid, aniline, 4-amino diphenylamine and the like.

The other essential ingredient, i.e. the component (A), in the inventive composition is a film-forming resinous material which should preferably be an alkali-soluble resin such as novolac resins obtained from a phenolic compound, e.g., phenol and cresol, and an aldehyde compound, e.g., formaldehyde, acrylic resins, poly(vinyl alcohols), copolymers of styrene and acrylic acid, polymers of hydroxystyrene, poly(vinyl hydroxybenzoates), poly(vinyl hydroxybenzals) and the like.

The positive-working photoresist composition of the invention is usually used in the form of a solution prepared by dissolving the above described photosensitizing component and the film-forming resinous component in an organic solvent. Suitable organic solvents include ketones, e.g., acetone, methyl ethyl ketone, cyclohexanone and isoamyl ketone, polyhydric alcohols and derivaties thereof, e.g., ethyleneglycol, ethyleneglycol monoacetate, monomethyl, monoethyl, monopropyl, monobutyl and monophenyl ethers of diethyleneglycol or diethyleneglycol monoacetate and the like, cyclic ethers, e.g., dioxane, and esters, e.g., methyl acetate, ethyl acetate and butyl acetate. These organic solvents can be used either singly or as a mixture of two kinds or more according to need.

More particularly, a preferable film-forming resinous material as the component (A) is a cresol novolac resin. Most preferably, the cresol novolac resin should be a binary mixture of two cresol novolac resins different in the weight-average molecular weight calculated with reference to polystyrenes and the isomeric ratio of the cresol mixture from which the resin has been prepared by the condensation reaction with formaldehyde. Namely, the first resin should have a weight-average molecular weight of at least 5000 and should be prepared from a cresol mixture composed of from 60 to 80% by weight of m-cresol and from 40 to 20% by weight of p-cresol and the second resin should have a weight-average molecular weight not exceeding 5000 and should be prepared from a cresol mixture composed of from 10 to 40% by weight of m-cresol and from 90 to 60% by weight of p-cresol and these two types of the cresol novolac resins should be blended in such a proportion that the overall contents of the m-cresol moiety and the p-cresol moiety in the blend is in the range from 30 to 46.5% by weight and in the range from 70 to 53.5% by weight, respectively.

Relative to the proportion of the components (A) and (B) in the positive-working photoresist composition of the invention, the composition should preferably comprise from 20 to 40% by weight of the photosensitizing component, i.e. component (B), based on the film-forming resinous component, i.e. component (A). When the amount of the photosensitizing component is larger than 40% by weight, the resultant composition may have a greatly decreased photosensitivity. When the amount of the photosensitizing component is too small, on the other hand, the cross sectional form of the line pattern of the photoresist layer may deviate from rectangularity if not to mention the decrease in the photosensitivity when the amount thereof is much smaller than the above mentioned lower limit.

The photosensitive composition of the invention should contain the alkali-insoluble and alkali-soluble dyes as the components (C) and (D) in such amounts that the total amount of the two dyes is in the range from 0.5 to 10% by weight or, preferably, from 1 to 5% by weight based on the total amount of the components (A) and (B). Further, the alkali-insoluble dye as the component (C) and the alkali-soluble dye as the component (D) should be combined in a weight ratio of 1:1 to 1:4. When the amount of the alkali-insoluble dye is too large relative to the alkali-soluble dye, the photosensitivity of the resultant positive-working photosensitive composition may be somewhat decreased. When the amount of the alkali-soluble dye is too large relative to the alkali-insoluble dye, on the other hand, the cross sectional form of the line pattern of the photoresist layer may deviate from rectangularity.

The inventive positive-working photoresist composition may be admixed optionally with various kinds of known additives having compatibility with the essential ingredients and conventionally used in photoresist compositions such as auxiliary resins, plasticizers, stabilizers, coloring agents to serve for further increasing the visibility of the patterned image after development, and so on.

The procedure for forming a patterned photoresist layer using the inventive photoresist composition may be any of conventional ones. For example, the surface of a substrate body such as a semiconductor silicon wafer is coated with the inventive photoresist composition in the form of an organic solution by use of a suitable coating machine such as spinners followed by drying to form a uniform photoresist layer thereon, which is then exposed pattern-wise to light on a minifying projector or a suitable apparatus for exposure through a photomask bearing a desired pattern followed by development using a developing solution such as an aqueous solution of an organic base such as tetramethyl ammonium hydroxide and choline in a concentration of 2 to 5% by weight so that the photoresist layer is selectively dissolved away on the areas where the photoresist composition has been imparted with increased solubility in the developing solution as a result of exposure to light to give a high-fidelity minified reproduction of the pattern on the photomask. Advantageously, the thus reproduced pattern is a very accurate reproduction of the photomask pattern to the utmost fineness having a line width in the submicron range with dimensional accuracy. The dimensional accuracy is not affected even on a substrate surface having a stepwise difference in levels in the exposure by minifying projection which may give poor contrast as a trend. Accordingly, the inventive positive-working photoresist composition can be used advantageously in the manufacture of high-precision semiconductor devices such as VLSIs.

By virtue of the above described unique formulation including two types of dyes, an advantage is obtained that a greatly improved dimensional stability can be obtained in the patterned photoresist layer formed of the inventive positive-working photosensitive composition against variation in the exposure dose to light. Moreover, each of the alkali-insoluble and alkali-soluble dyes has absorptivity of light in the wavelength region in which the photosensitive composition has sensitivity to light so that the undesirable phenomenon of halation in the photosensitive layer due to the reflection from the underlying aluminum layer can be effectively prevented. In addition, the difference in the solubility behavior between the two dyes in an alkaline developer solution may have a beneficial effect on the cross sectional form of the line pattern in the photoresist layer after development with an alkaline developer solution to impart improved rectangularity so that a quite satisfactory patterned resist layer can be obtained with a high resolving power and excellent dimensional accuracy.

In the following, the positive-working photosensitive composition of the invention is described in more detail by way of examples.

EXAMPLE 1

A positive-working photosensitive composition was prepared by dissolving 23 g of a cresol novolac resin and 7 g of a naphthoquinone-1,2-diazido-5-sulfonic acid ester with 2,3,4-trihydroxy benzophenone in 70 g of ethyleneglycol monethyl ether acetate and then adding 4-ethoxy-4'-diethylamino azobenzene as an alkali-insoluble dye and 4-hydroxy-4'-dimethylamino azobenzene as an alkali-soluble dye in amounts of 1% by weight and 2% by weight, respectively, based on the total amount of the cresol novolac resin and the 1,2-naphthoquinone diazidosulfonic acid ester followed by filtration through a membrane filter having pores of 1.0 μm diameter.

The thus prepared photosensitive composition in the form of a solution was uniformly applied in an average thickness of 2.0 μm as dried by using a spinner to the surface of a substrate of an aluminum-coated silicon wafer of 4 inches diameter having a difference in the surface levels of 1.0 μm at the largest. The substrate coated with the photosensitive composition was dried and prebaked at 110° C. for 90 seconds on a hot plate to complete the layer of the photosensitive composition. The photosensitive layer on the substrate surface was subjected to pattern-wise exposure to light through a test chart mask on a minifying projection exposure apparatus (Wafer Stepper Model 1505 G3A, manufactured by Nippon Kogaku Kogyo Co.) and then developed with a 2.38% by weight aqueous solution of tetramethyl ammonium hydroxide at 23° C. for 30 seconds to form a patterned resist layer on the substrate surface. An electron microscopic examination of the patterned resist layer indicated that the patterned resist layer is a high-fidelity reproduction of the photomask pattern even for the line pattern having a width of 0.8 μm. The fidelity of reproduction was quite satisfactory not only on the areas at the upper side but also at the lower side of the boundary line between the areas having a difference in the surface levels despite the relatively small thickness of the resist layer on the upper side areas. The patterned lines had a cross sectional form of satisfactory rectangularity.

EXAMPLE 2

Two different cresol novolac resins were obtained from different cresol mixtures and formaldehyde. Thus, the first cresol novolac resin was prepared in a conventional manner from a 60:40 by weight mixture of m-cresol and p-cresol which was admixed with formalin and subjected to condensation reaction in the presence of oxalic acid as a catalyst. This first cresol novolac resin had a weight-average molecular weight of about 28,000. The second cresol novolac resin having a weight-average molecular weight of about 2000 was prepared in about the same manner as above excepting the use of a 40:60 by weight mixture of m-cresol and p-cresol.

A photosensitive composition was prepared by dissolving 30 parts by weight of the first cresol novolac resin, 70 parts by weight of the second cresol novolac resin and 30 parts by weight of a reaction product of 1.0 mole of 2,3,4-trihydroxy benzophenone and 1.6 moles of naphthoquinone-1,2-diazido-5-sulfonyl chloride as the photosensitizing component in 390 parts by weight of ethyleneglycol monoethyl ether acetate with admixture of 4-ethoxy-4'-diethylamino azobenzene as an alkali-insoluble dye and 4-hydroxy-4'-dimethylamino azobenzene as an alkali-soluble dye in amounts of 1% by weight and 2% by weight, respectively, based on the total amount of the cresol novolac resins and the photosensitizing component followed by filtration through a membrane filter having pores of 0.2 μm diameter.

The thus prepared photosensitive composition in the form of a solution was used in the test patterning and electron microscopic examination of the patterned resist layer in the same manner as in Example 1 to give substantially the same satisfactory results.

EXAMPLE 3

The experimental procedure was substantially the same as in Example 1 excepting the use of 2,4-dihydroxy-4'-nitro azobenzene in place of 4-hydroxy-4'-dimethylamino azobenzene as the alkali-soluble dye. The results of the electron microscopic examination of the patterned resist layer were also quite satisfactory.

EXAMPLE 4

The experimental procedure was substantially the same as in Example 1 excepting the use of a coumarin-based dye which was 3-(1H-benzimidazol-2-yl)-7-diethylamino coumarin expressed by the structural formula

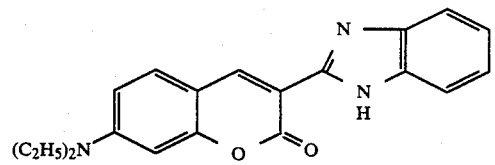

in place of 4-ethoxy-4'-diethylamino azobenzene as the alkali-insoluble dye and 2,4-dihydroxy azobenzene in place of 4-hydroxy-4'-dimethylamino azobenzene as the alkali-soluble dye each in an amount of 2% by weight based on the total amount of the cresol novolac resin and the photosensitizing compound. The results of the electron microscopic examination of the patterned resist layer were also quite satisfactory.

EXAMPLE 5

The experimental procedure was substantially the same as in Example 1 excepting the use of 4-hydroxy-4'-diethylamino azobenzene in place of 4-hydroxy-4'-dimethylamino azobenzene as the alkali-soluble dye. The results of the electron microscopic examination of the patterned resist layer were also quite satisfactory.

EXAMPLE 6

The experimental procedure was substantially the same as in Example 4 excepting the use of 2,4-dihydroxy-4'nitro azobenzene in place of 2,4-dihydroxy azobenzene as the alkali-soluble dye. The results of the electron microscopic examination of the patterned resist layer were also quite satisfactory.

What is claimed is:

1. A positive-working photosensitive composition which is a mixture consisting essentially of:
   (A) an alkali soluble film-forming polymeric resin;
   (B) a photosensitizer which is a quinome diozide;
   (C) an alkali-insoluble dye soluble in oils and organic solvents having absorptivity of light in the wavelength region from 230 to 500 nm having no phenolic hydroxy group; and
   (D) an alkali-soluble dye soluble in oils and organic solvents having absorptivity of light in the wavelength region from 230 to 500 nm having at least one phenolic hydroxy group in a molecule; the total amount of the components (C) and (D) being in the range from 0.5 to 10% by weight based on the total amount of the components (A) and (B), and the components (C) and (D) are contained in a weight ratio in the range from 1:1 to 1:4.

2. The positive-working photosensitive composition as claimed in claim 1 wherein the alkali-insoluble dye as the component (C) is an azobenzene compound represented by the general formula

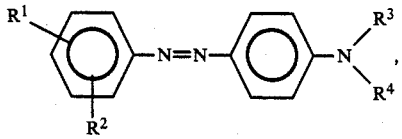

in which $R^1$ is an alkoxy group having 1 to 6 carbon atoms, $R^2$ is a hydrogen atom or an alkyl group having 1 to 4 carbon atoms and $R^3$ and $R^4$ are each an alkyl group having 2 to 4 carbon atoms.

3. THe positive-working photosensitive composition as claimed in claim 1 wherein the alkali-soluble dye as the component (D) is an azo compound having at least one phenolic hydroxy group in a molecule selected from the compounds represented by one of the general formulas

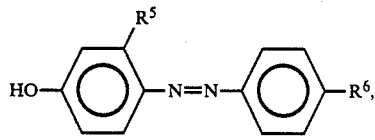

in which $R^5$ is a hydrogen atom or a hydroxy group and $R^6$ is a hydrogen atom or a hydroxy group and $R^6$ is a hydrogen atom, nitro group or dialkylamino group,

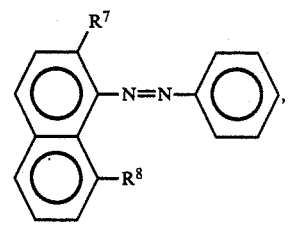

in which one of $R^7$ and $R^8$ is a hydroxy group, the other being a hydrogen atom, and

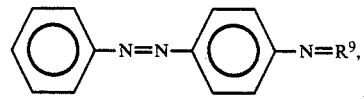

in which $R^9$ is a divalent group selected from the class consisting of 4-hydroxybenzylidene, 2-hydroxyphenylimino and 2-hydroxy α-naphthylimino groups.

4. The positive-working photosensitive composition as claimed in claim 1 wherein the film-forming polymeric resin as the component (A) is a cresol novolac resin.

5. The positive-working photosensitive composition as claimed in claim 4 wherein the cresol novolac resin is a binary mixture of a first cresol novolac resin having a weight-average molecular weight of at least 5000, of which the cresol moiety is composed of 60 to 80% of m-cresol moiety and 40 to 20% of p-cresol moiety, and a second cresol novolac resin having a weight-average molecular weight of smaller than 5000, of which the cresol moiety is composed of 10 to 40% of m-cresol moiety and 90 to 60% of p-cresol moiety, in such a proportion that the cresol moiety in the binary mixture of the first and second cresol novolac resins is composed of 30 to 46.5% of the m-cresol moiety and 70 to 53.5% of the p-cresol moiety.

* * * * *